United States Patent
Jung et al.

(10) Patent No.: US 8,547,153 B2
(45) Date of Patent: Oct. 1, 2013

(54) DELAY LOCKED LOOP

(71) Applicant: Industry-Academic Cooperation Foundation, Yonsei University, Seoul (KR)

(72) Inventors: Seongook Jung, Seoul (KR); Jung-Hyun Park, Seoul (KR); Kyung Ho Ryu, Seoul (KR); Dong Hun Jung, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 13/679,045

(22) Filed: Nov. 16, 2012

(65) Prior Publication Data

US 2013/0162312 A1 Jun. 27, 2013

(30) Foreign Application Priority Data

Dec. 23, 2011 (KR) .................. 10-2011-0141298

(51) Int. Cl.
*H03L 7/06* (2006.01)

(52) U.S. Cl.
USPC .......................... 327/158; 327/147

(58) Field of Classification Search
USPC .................................. 327/149, 158
See application file for complete search history.

(56) References Cited

U.S. PATENT DOCUMENTS

| | | | | |
|---|---|---|---|---|
| 7,088,159 | B2 * | 8/2006 | Kwak et al. | 327/161 |
| 7,830,186 | B2 * | 11/2010 | Yun et al. | 327/158 |
| 7,932,759 | B2 * | 4/2011 | Abe et al. | 327/158 |
| 8,373,478 | B2 * | 2/2013 | Ku | 327/158 |
| 2007/0103212 | A1 * | 5/2007 | Lee et al. | 327/149 |
| 2010/0060334 | A1 * | 3/2010 | Abe et al. | 327/158 |
| 2010/0090735 | A1 * | 4/2010 | Cho | 327/158 |
| 2010/0141312 | A1 * | 6/2010 | Lee | 327/158 |
| 2012/0274373 | A1 * | 11/2012 | Ku | 327/158 |

FOREIGN PATENT DOCUMENTS

| | | |
|---|---|---|
| KP | 10-2008-0076615 A | 8/2008 |
| KR | 10-2002-0067736 A | 8/2002 |
| KR | 10-2003-0017474 A | 3/2003 |
| KR | 10-2003-0052361 A | 6/2003 |
| KR | 10-2004-0103035 A | 12/2004 |
| KR | 10-2011-0088961 A | 8/2011 |
| KR | 10-2011-0131757 A | 12/2011 |

* cited by examiner

*Primary Examiner* — Adam Houston
(74) *Attorney, Agent, or Firm* — Carter, DeLuca, Farrell & Schmidt LLP

(57) ABSTRACT

A delay locked loop in accordance with some embodiments of the inventive concept may include a delay signal generation part generating a first delay signal having a first phase and a second delay signal having a second phase by delaying a reference signal on the basis of a delay control signal; a phase synthesizing part generating at least one third signal having a third phase using the first delay signal and the second delay signal; and a phase detection part generating a control code by comparing the reference signal with each of the first delay signal, the second delay signal and the third signal.

20 Claims, 9 Drawing Sheets

DELAY LOCKED LOOP

CROSS-REFERENCE TO RELATED APPLICATIONS

This U.S. non-provisional patent application claims priority under 35 U.S.C. §119 of Korean Patent Application No. 10-2011-0141298, filed on Jul. 23, 2012, the entire contents of which are hereby incorporated by reference.

BACKGROUND

The inventive concept disclosed herein relates to delay locked loops, and more particularly, to a digital delay locked loop.

A delay locked loop (DLL) is used in a system requiring a stable clock such as a clock generator, a memory and the like and is utilized for a use such as a deskew buffer. A delay locked loop (DLL) is classified into two types, an analog delay locked loop and a digital delay locked loop. An analog delay locked loop has a superior jitter performance while having large power consumption, a long locking time and a large chip area. A digital delay locking loop increases a degree of a memory cell integration with a comparably short locking time and a small area.

However, a digital delay locked loop has a disadvantage that a static phase offset is great as compared with an analog delay locked loop. In a general digital delay locked loop, a size of detection window for locking a reference signal is designed to be greater than a resolution of fine delay line. This is because a change of process voltage temperature (PVT) should be considered. Consequently, since the maximum static phase offset of digital delay locked loop depends on a size of detection window, a general digital delay locked loop has a limit as to reduce the maximum static phase offset.

SUMMARY

Embodiments of the inventive concept provide a delay locked loop. The delay locked loop may include a delay signal generation part generating a first delay signal having a first phase and a second delay signal having a second phase by delaying a reference signal on the basis of a delay control signal; a phase synthesizing part generating at least one third signal having a third phase using the first delay signal and the second delay signal; and a phase detection part generating a control code by comparing the reference signal with each of the first delay signal, the second delay signal and the third signal.

Embodiments of the inventive concept also provide a delay locked loop. The delay locked loop may include a plurality of fine delay lines delaying a reference signal according to a delay control signal to define a detection window; a phase synthesizing part synthesizing a signal from the output signals of the plurality of fine delay lines to divide the detection window into least two fine detection window; and a phase detection part judging whether the reference signal is in the at least two fine detection windows and in two areas outside the detection window, to generate a control code.

Embodiments of inventive concept also provide a method for phase adjustment in a delay locked loop (DLL). The method may include delaying a clock signal to generate at least two delay signals including first and second delay signals with different phase; generating at least one signal with a phase between the phases of the first and second delay signals; and comparing a phase of the clock signal with the first delay signal, the second delay signal and the at least one signal.

BRIEF DESCRIPTION OF THE FIGURES

Embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF THE EMBODIMENTS

Figure 1:
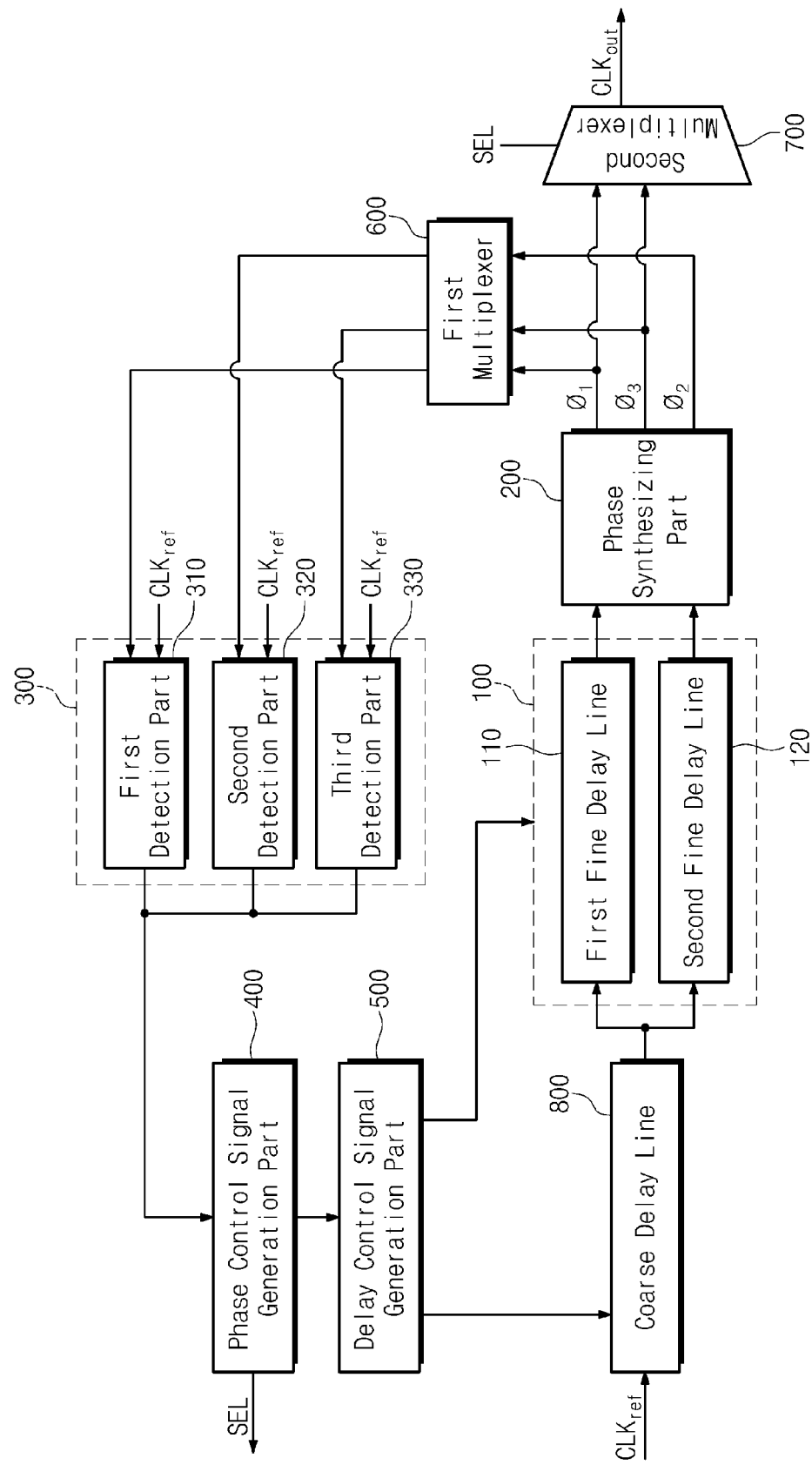
FIG. 1 is a drawing illustrating a delay locked loop in accordance with some embodiments of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. It will be understood that, although the terms first, second, etc. may be used herein to describe various elements, these elements should not be limited by these terms. These terms are only used to distinguish one element from another.

Some embodiments of the inventive concept herein relates to delay locked loops, and more particularly, to a digital delay locked loop. A delay locked loop (DLL) may be used as a deskew buffer. That is, the delay locked loop may be used to remove a clock skew of system on chip (SoC) caused by a wire delay and a process voltage temperature (PVT) variation.

FIG. 1 is a drawing illustrating a delay locked loop in accordance with some embodiments of the inventive concept.

Referring to FIG. 1, the delay locked loop may include a delay signal generation part 100, a phase synthesizing part 200, a phase detection part 300, a phase control signal generation part 400, a delay control signal generation part 500, a first multiplexer 600 and a second multiplexer 700.

The delay locked loop may further include a coarse delay line 800.

The delay signal generation part 100 delays a reference signal CLKref on the basis of delay control signal to generate a first delay signal Φ1 having a first phase and a second delay signal Φ2 having a second phase. The reference signal CLKref may be delayed for a predetermined time by the coarse delay line 800 prior to be input to the delay generation part 100.

The delay signal generation part 100 may include two fine delay lines 110 and 120. For example, the delay signal generation part 100 may include a first fine delay line 110 and a second fine delay line 120.

In another aspect, it will be appreciated that each of the two fine delay lines 110 and 120 delays the reference signal CLKref on the basis of the delay control signal to form a detection window area. Herein, the detection window area may be defined as a predetermined area in which a phase difference between the first delay signal Φ1 and the second delay signal Φ2 occurs.

Figure 2:
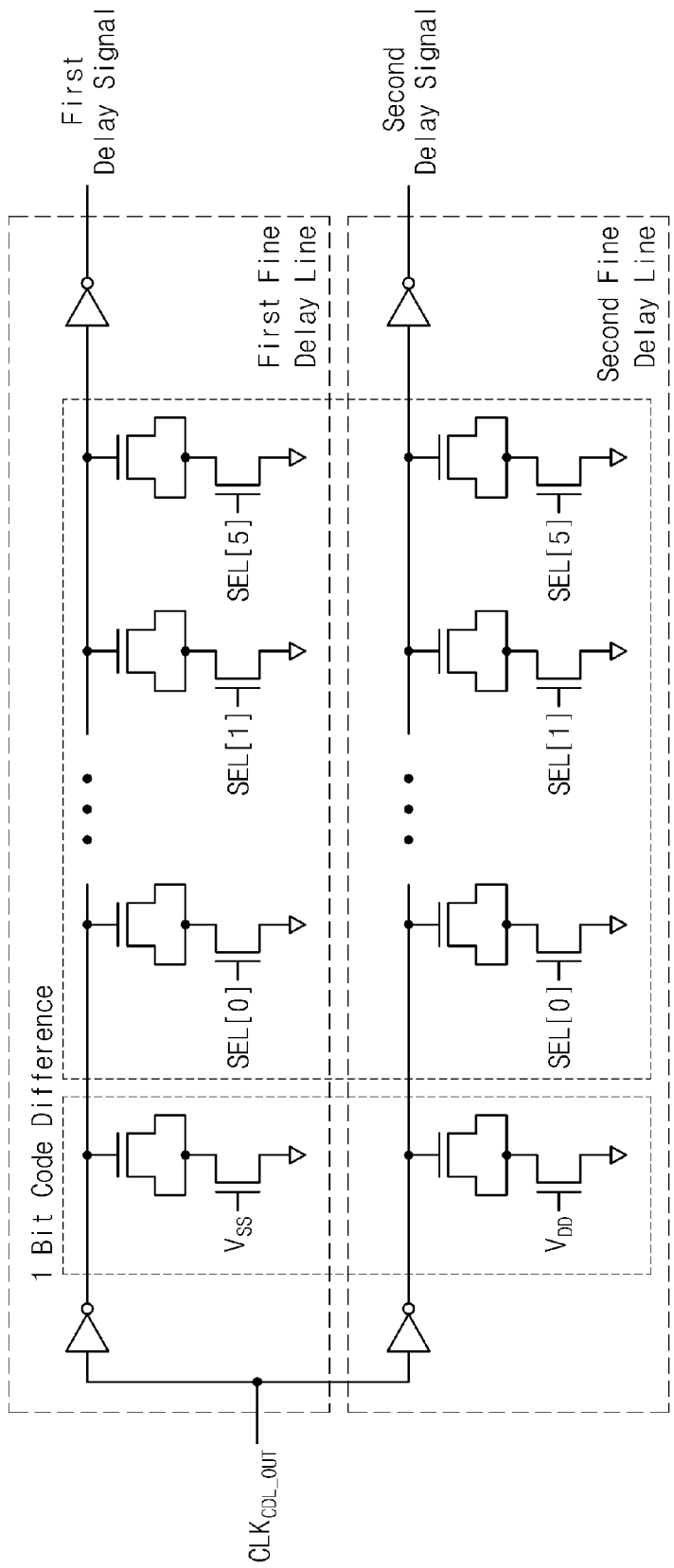
FIG. 2 is a drawing illustrating a delay signal generation part of delay locked loop in accordance with some embodiments of the inventive concept in detail.

FIG. 2 is a drawing illustrating a delay signal generation part of delay locked loop in accordance with some embodiments of the inventive concept in detail.

Referring to FIG. 2, the delay signal generation part 100 may include the first fine delay line 110 and the second fine delay line 120. Each of the first fine delay line 110 and the second fine delay line 120 may comprise a plurality of MOS transistors. The first delay signal Φ1 generated through the first fine delay line 110 and the second delay signal Φ2 generated through the second fine delay line 120 may have a phase difference of one MOS capacitance (MOSCAP) delay.

In the case that any one of the plurality of MOS transistors of the first fine delay line 110 does not operate (i.e., turned-off) and a MOS transistor of the second fine delay line 120 corresponding to that MOS transistor of the first fine delay line 110 operates (turned-on), the second delay signal Φ2 may be delayed more than the first delay signal Φ1. For example, the second delay signal Φ2 may be more delayed by a phase corresponding to 1 bit code than the first delay signal Φ1. That is, a phase of the first delay signal Φ1 may be faster than that of the second delay signal Φ2. The first fine delay line 110 and the second delay signal Φ2 may be transmitted to the phase synthesizing part 200.

As described above, since a detection window area is formed using edges of the first fine delay line 110 and the second delay signal Φ2, the delay locked loop in accordance with some embodiments of the inventive concept may be independent from a change in process voltage temperature (PVT).

Referring back to FIG. 1, the phase synthesizing part 200 can generate a third signal Φ3 having a third phase using the first delay signal Φ1 and the second delay signal Φ2. The third signal Φ3 may have an intermediate phase value between the first delay signal Φ1 and the second delay signal Φ2. For convenience of description, it is assumed that the third signal Φ3 is one.

In another aspect, it will be appreciated that the phase synthesizing part 200 may form at least two fine detection window areas by dividing the detection window area. The fine detection window area may be defined as each area that is generated by dividing the detection window area into two equal parts. In the embodiment, a case that the number of the fine detection window areas is two will be described as an illustration. The number of fine detection window area can be more than two.

The phase synthesizing part 200 may be a phase blender. The phase blender is disclosed in Patent Applications No. 10-2006-7008287 and 10-2001-0008033 and the entire the entire contents of which are hereby incorporated by reference.

The phase synthesizing part 200 may interpolate the first delay signal Φ1 and the second delay signal Φ2 to generate the third signal Φ3 having a third phase.

The phase detection part 300 may compare each of the first, second and third delay signals Φ1, Φ2 and Φ3 with a phase of the reference signal CLKref to generate a control code. The phase detection 300 may include a first detection part 310, a second detection part 320 and a third detection part 330. The first, second and third detection parts 310, 320 and 330 may receive the first, second and third delay signals Φ1, Φ2 and Φ3 respectively.

The first detection part 310 may compare a phase of the first delay signal Φ1 with a phase of the reference signal CLKref to generate a first control code. The second detection part 320 may compare a phase of the second delay signal Φ2 with a phase of the reference signal CLKref to generate a second control code. The third detection part 330 may compare a phase of the third delay signal Φ3 with a phase of the reference signal CLKref to generate a third control code. The control code may include the first, second and third control codes.

In another aspect, the phase detection part 300 may compare the first and second fine detection window areas and first and second areas outside the detection window area with the reference signal CLKref to generate a control code.

Figure 3:
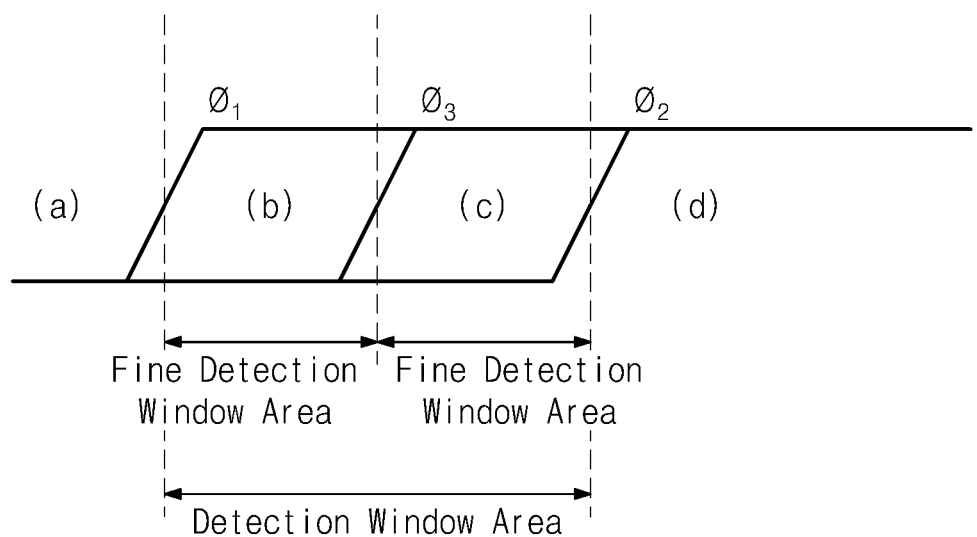
FIG. 3 is a timing diagram for explaining a detection window area of delay locked loop in accordance with some embodiments of the inventive concept.

FIG. 3 is a timing diagram for explaining a detection window area of delay locked loop in accordance with some embodiments of the inventive concept.

Referring to FIG. 3, a detection window area is illustrated. The detection window area may be defined by the first delay signal Φ1 generated from the first fine delay line 110 and the second delay signal Φ2 generated from the second fine delay line 120.

The detection window area may have a pulse width corresponding to resolution of the first and second fine delay lines 110 and 120.

The fine detection window areas (b, c) may be defined on the basis of the third signal Φ3. For example, each of the fine detection window areas (b, c) may have a pulse width which is half the size of the pulse width of the detection window area.

A first area (a) and a second area (d) may be defined on the basis of the detection window area. The first area (a) may be an area of which a phase is faster than a phase of the first delay signal Φ1. The second area (d) may be an area of which a phase is slower than a phase of the second delay signal Φ2.

FIGS. 4A through 4D are drawings for explaining an operation of phase detection part of delay locked loop in accordance with some embodiments of the inventive concept.

Referring to FIGS. 4A through 4D, the phase detection part 300 can judge where a rising edge of the reference signal CLKref is included among the first and second areas (a, d) and the two fine detection window areas (b, c).

The first detection part 310 may judge where the rising edge of reference signal CLKref is included among the first area (a) and the fine detection window area (b) to generate a first control code. The second detection part 320 may judge where the rising edge of the reference signal CLKref is included among the second area (d) and the fine detection window area (c) to generate a second control code. The third detection part 330 may judge where the rising edge of the reference signal CLKref is included among the fine detection window areas (b, c) to generate a third control code.

Each of the first, second and third control codes may be an upward control value and a downward control value. The upward control value may be, for example, 1. The downward control value may be, for example, 0. The upward control value may be a control code being output when a phase of the reference signal CLKref is faster than that of the signal being compared (e.g., the first, second or third delay signals Φ1, Φ2 or Φ3). The downward control value may mean a control code being output when a phase of the reference signal CLKref is slower than that of the signal being compared (e.g., the first, second or third delay signals Φ1, Φ2 or Φ3).

Figure 4A:
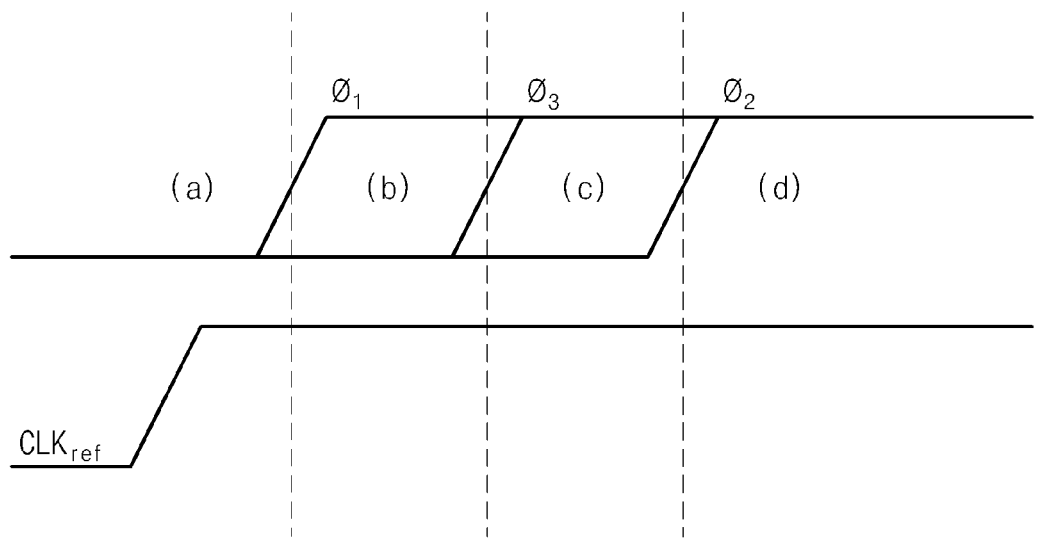
FIGS. 4A through 4D are drawings for explaining an operation of phase detection part of delay locked loop in accordance with some embodiments of the inventive concept.

Referring to FIG. 4A, a case that the reference signal CLKref is included in the first area (a) is illustrated.

In the case that the reference signal CLKref is included in the first area (a), the first, second and third detection parts 310, 320 and 330 can output a control code having an upward control value (ex. 1). In this case, a delay of the first and second fine delay lines 110 and 120 is controlled to decrease.

Figure 4B:
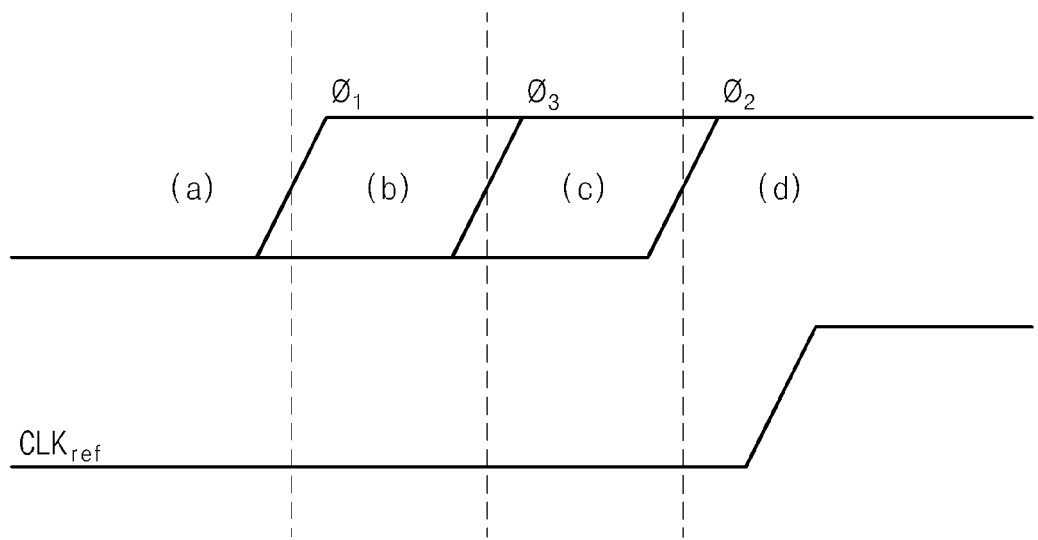

Referring to FIG. 4B, a case that the reference signal CLKref is included in the second area (d) is illustrated.

In the case that the reference signal CLKref is included in the second area (d), the first, second and third detection parts 310, 320 and 330 can output a control code having a downward control value (ex. 0). In this case, a delay of the first and second fine delay lines 110 and 120 is controlled to increase.

Figure 4C:
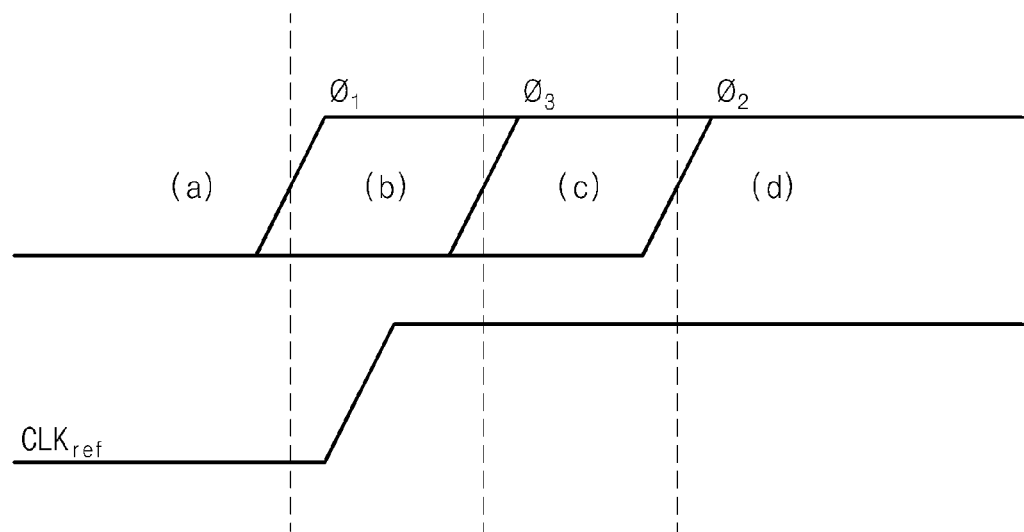

Referring to FIG. 4C, a case that the reference signal CLKref is included in the fine detection window area (b) is illustrated.

In the case that the reference signal CLKref is included in the fine detection window area (b), the first detection part 310 can output a control code having an upward control value (ex. 1) and the second and third detection parts 320 and 330 can output a control code having a downward control value (ex. 0). In this case, the first and second delay signals Φ1 and Φ2 are controlled to be locked.

Figure 4D:
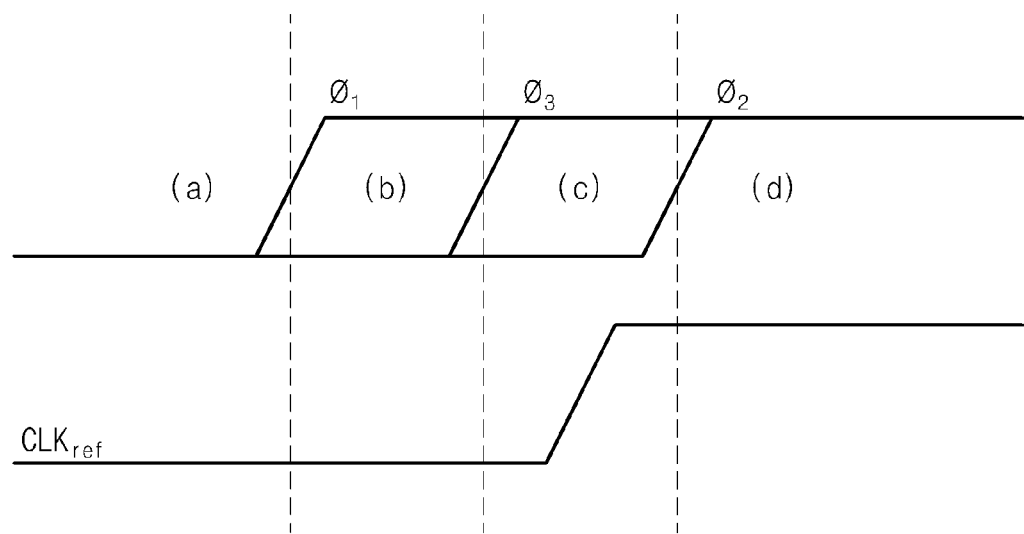

Referring to FIG. 4D, a case that the reference signal CLKref is included in the fine detection window area (c) is illustrated.

In the case that the reference signal CLKref is included in the fine detection window area (c), the first and second detection parts 310 and 320 can output a control code having an upward control value (ex. 1) and the third detection part 330 can output a control code having a downward control value (ex. 0). In this case, the first and second delay signals Φ1 and Φ2 are controlled to be locked.

Referring back to FIG. 1, the phase control signal generation part 400 can generate a phase control signal using the first, second and third control codes. The phase control signal may include an upward control signal, a downward control signal and a locking control signal SEL. The upward control signal may be a signal controlling so that the first and second delay signals Φ1 and Φ2 become more delayed. The downward control signal may mean a signal controlling so that the first and second delay signals Φ1 and Φ2 become less delayed. The locking control signal may be a signal controlling so that the amount of delay of the first and second delay signals Φ1 and Φ2 becomes fixed.

The delay control generation part 500 can generate a delay control signal using the phase control signal. The delay control signal can be transmitted to the delay signal generation part 100 to control the amount of delay of the first and second fine delay lines 110 and 120.

The first multiplexer 600 can temporarily store the first, second and third delay signals Φ1, Φ2 and Φ3. The first multiplexer 600 can transmit the first delay signal Φ1 to the first detection part 310, the second delay signal Φ2 to the second detection part 320 and the third delay signal Φ3 to the third detection part 330.

The second multiplexer 700 can select one of the first and third delay signals Φ1 and Φ3 being transmitted from the phase synthesizing part 200 to output the selected delay signal. The second multiplexer 700 can select one of the first and third delay signals Φ1 and Φ3 on the basis of the locking control signal SEL to output the selected delay signal. The second multiplexer 700 may select one among the first and third delay signals Φ1 and Φ3 which is closer to a rising edge of the reference signal CLKref to output the selected delay signal. For example, in FIG. 4C, the second multiplexer 700 can select the first delay signal Φ1 to output it. In FIG. 4D, the second multiplexer 700 can select the third delay signal Φ3 to output it.

As described above, the delay locked loop in accordance with some embodiments of the inventive concept can reduce the static maximum phase offset by forming two detection windows having a pulse width which is half the size of the resolution of the fine delay line. The delay locked loop can reduce the maximum static phase offset by half.

Figure 5:
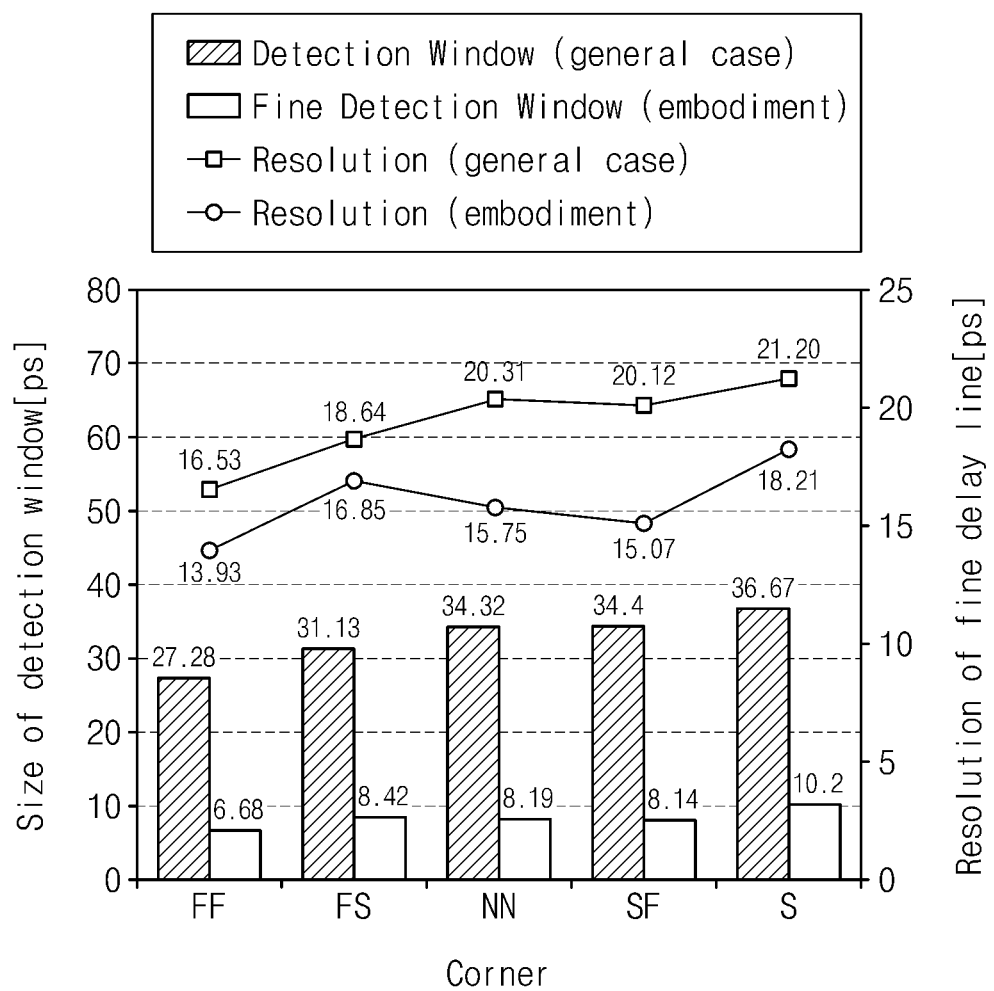
FIG. 5 is a graph illustrating a corner simulation result of size and resolution of detection window of delay locked loop in accordance with some embodiments of the inventive concept.

FIG. 5 is a graph illustrating a corner simulation result of size and resolution of detection window of delay locked loop in accordance with some embodiments of the inventive concept. The delay locked loop uses 0.1 μm process and a supply voltage is set to be 1.2V. The scope of operation frequency is from 700 MHz to 2.0 GHz.

Referring to FIG. 5, resolution of fine delay line of the delay locked loop in accordance with some embodiments of the inventive concept is improved by 17.8% as compared with resolution of general fine delay line. The size of fine detection window of the delay locked loop in accordance with some embodiments of the inventive concept is reduced by 74.6%.

Figure 6:
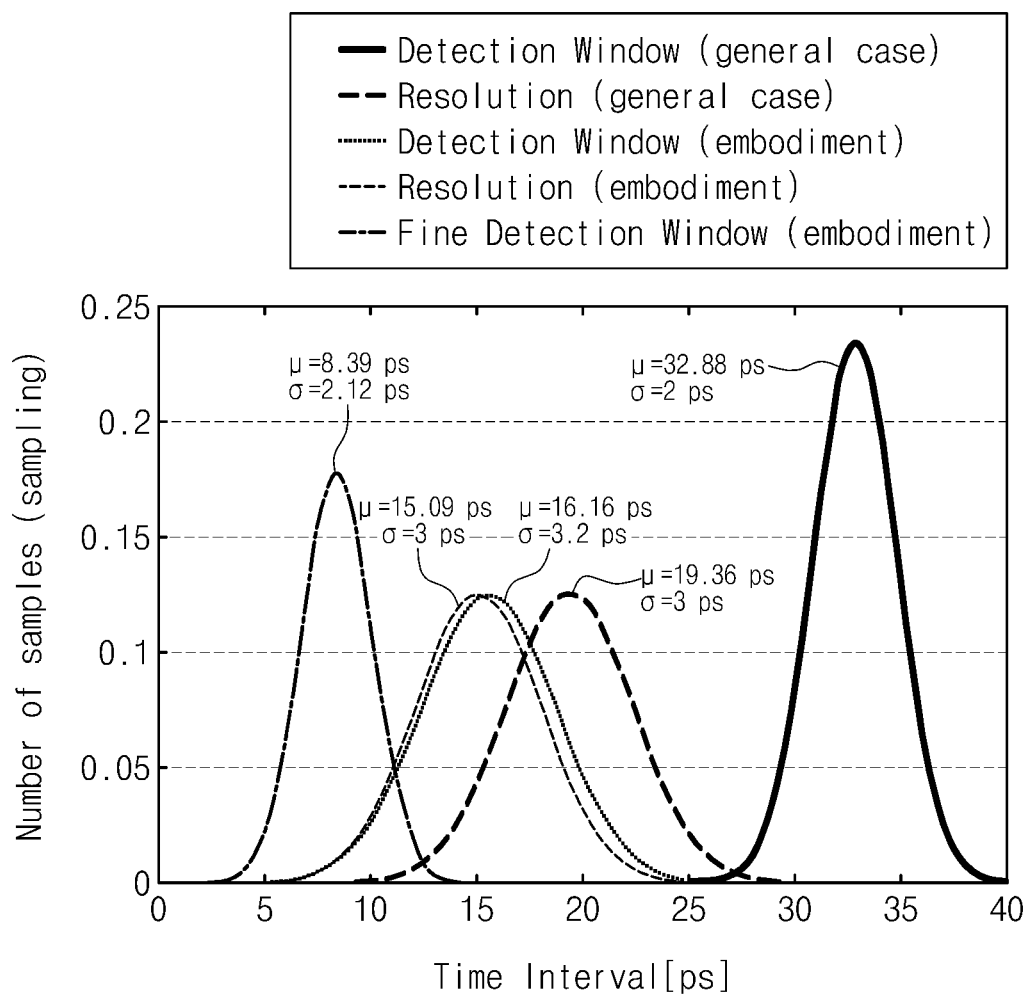
FIG. 6 is a graph illustrating a Monte Carlo simulation result of size and resolution of detection window of delay locked loop in accordance with some embodiments of the inventive concept.

FIG. 6 is a graph illustrating a Monte Carlo simulation result of size and resolution of detection window of delay locked loop in accordance with some embodiments of the inventive concept. The Monte Carlo simulation data is applied to Gaussian function using a least squares method.

Referring to FIG. 6, a mean value (μ) and a stand deviation (σ) of general fine delay line are 19.36 ps and 3 ps respectively. A mean value (μ) and a stand deviation (σ) of fine delay line of the delay locked loop in accordance with some embodiments of the inventive concept are 15.09 ps and 3 ps respectively.

In case of general delay locked loop, since the size of detection window is set to be greater than resolution of fine delay line considering a change of PVT, a mean value (μ) and a stand deviation (σ) of general delay locked loop are 32.88 ps and 2 ps respectively.

A mean value (μ) and a stand deviation (σ) of detection window area of the delay locked loop in accordance with some embodiments of the inventive concept are 16.16 ps and 3.2 ps respectively. A mean value (μ) and a stand deviation (σ)

of fine delay line of the delay locked loop in accordance with some embodiments of the inventive concept are 8.39 ps and 2.12 ps respectively.

Figure 7:
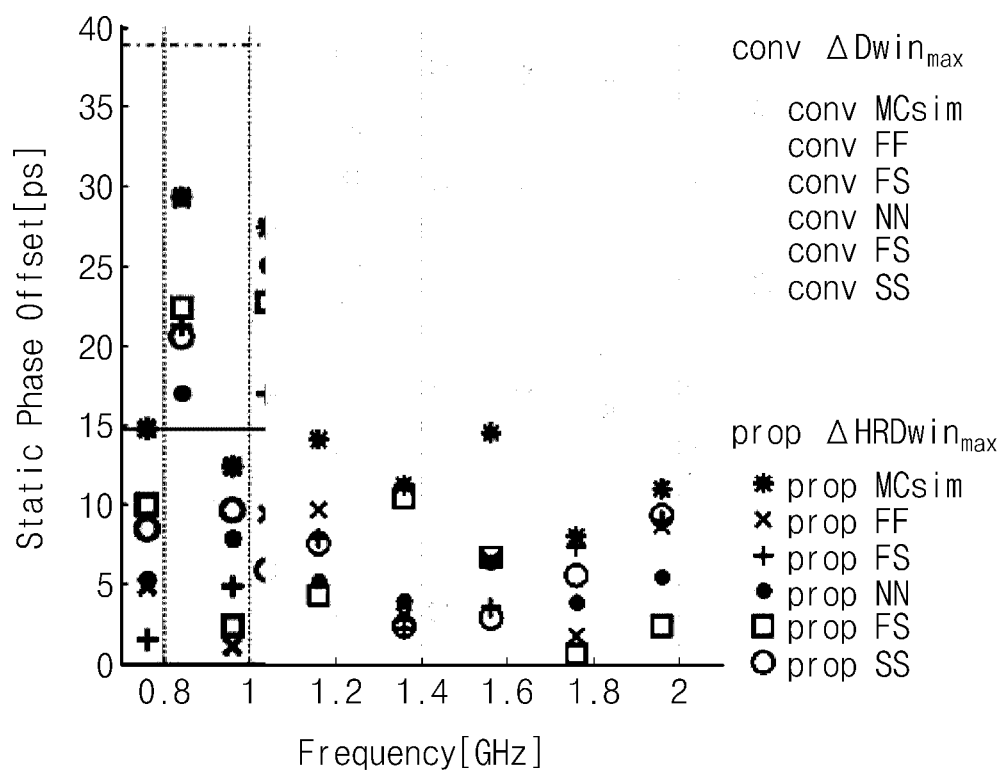
FIG. 7 is a graph illustrating a result that a corner simulation and a Monte Carlo simulation are performed on a static phase offset relative to a frequency of delay locked loop in accordance with some embodiments of the inventive concept.

FIG. 7 is a graph illustrating a result that a corner simulation and a Monte Carlo simulation are performed on a static phase offset relative to a frequency of delay locked loop in accordance with some embodiments of the inventive concept.

Referring to FIG. 7, the maximum static phase offset of general delay locked loop is distributed from 3.32 ps to 37.54 ps in the range of the whole operating frequency.

The maximum static phase offset of delay locket loop in accordance with some embodiments of the inventive concept is distributed from 1.13 ps to 14.75 ps. That is, the scope of distribution of the maximum static phase offset of delay locket loop in accordance with some embodiments of the inventive concept is reduced by about 62.4% as compared with the scope of distribution of the maximum static phase offset of general delay locked loop.

Figure 8:
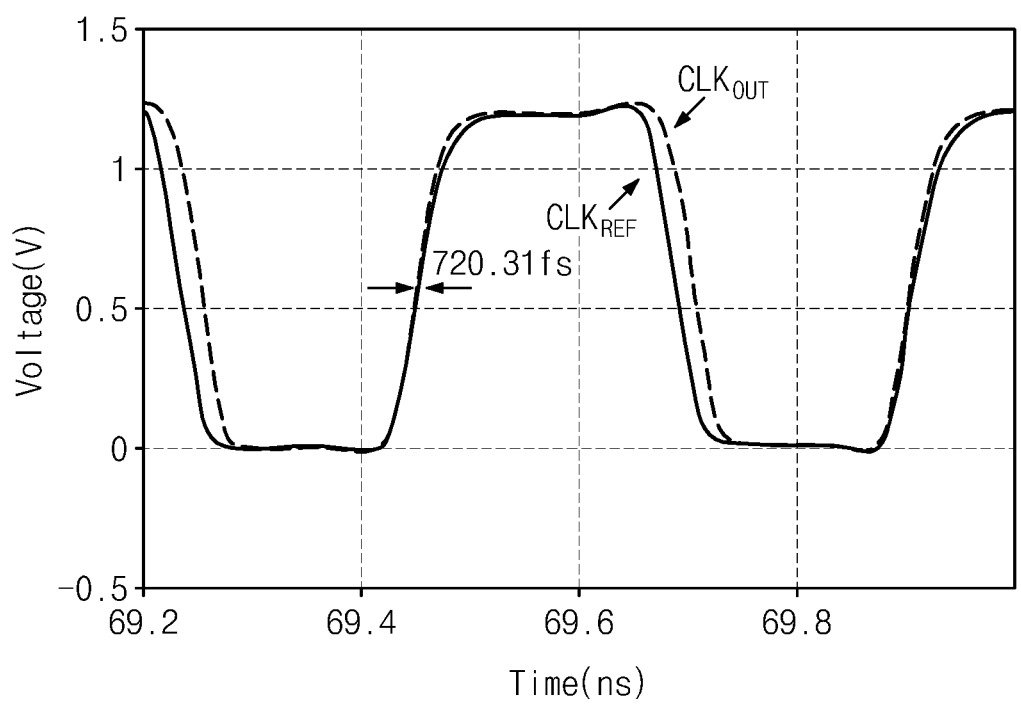
FIG. 8 is a graph of comparing a reference signal and an output signal of delay locked loop in accordance with some embodiments of the inventive concept.

FIG. 8 is a graph of comparing a reference signal and an output signal of delay locked loop in accordance with some embodiments of the inventive concept.

FIG. 8 is a graph of comparing a reference signal CLKref and an output signal CLKout that the reference signal CLKref is phase-converted by 360°. A static phase error between the reference signal CLKref and the output signal CLKout is 720.31 fs.

The delay locked loop in accordance with some embodiments of the inventive concept can reduce the maximum static phase offset.

The delay locked loop in accordance with some embodiments of the inventive concept may be independent from a change of PVT.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the present invention. Accordingly, all such modifications are intended to be included within the scope of the present invention as defined in the claims. The present invention is defined by the following claims, with equivalents of the claims to be included therein.

What is claimed is:

1. A delay locked loop comprising:
   a delay signal generation part generating a first delay signal having a first phase and a second delay signal having a second phase by delaying a reference signal in response to a delay control signal;
   a phase synthesizing part generating at least one third signal having a third phase using the first delay signal and the second delay signal; and
   a phase detection part generating a control code by comparing the reference signal with each of the first delay signal, the second delay signal and the at least one third signal.

2. The delay locked loop of claim 1, wherein the delay signal generation part comprises:
   a first fine delay line to generate the first delay signal; and
   a second fine delay line to generate the second delay signal, wherein the first and second delay signals have 1 bit delay difference.

3. The delay locked loop of claim 1, wherein the phase synthesizing part is a phase blender.

4. The delay locked loop of claim 1, wherein the phase detection part comprises:
   a first detection part generating a first control code by comparing the first delay signal with the reference signal;
   a second detection part generating a second control code by comparing the second delay signal with the reference signal;
   a third detection part generating a third control code by comparing the third signal with the reference signal.

5. The delay locked loop of claim 4, further comprising a phase control signal generation part generating a phase control signal using the first, second and third control codes.

6. The delay locked loop of claim 5, wherein the phase control signal comprises an upward control signal, a downward control signal and a locking control signal.

7. The delay locked loop of claim 5, further comprising a delay control signal generation part generating the delay control signal using the phase control signal.

8. The delay locked loop of claim 1, further comprising a first multiplexer storing the first delay signal, the second delay signal and the third signal.

9. The delay locked loop of claim 1, further comprising a second multiplexer selecting the first delay signal or the third signal to output the selected signal.

10. A delay locked loop comprising:
    a plurality of fine delay lines delaying a reference signal according to a delay control signal to define a detection window;
    a phase synthesizing part synthesizing a signal to divide the detection window into at least two fine detection window; and
    a phase detection part judging whether the reference signal is in the at least two fine detection windows and in first and second areas outside the detection window, to generate a control code.

11. The delay locked loop of claim 10, wherein the phase synthesizing part synthesizes the signal from the output signals of the plurality of fine delay lines.

12. The delay locked loop of claim 10, wherein the plurality of fine delay lines comprises two fine delay lines and wherein the detection window has a size corresponding to a resolution of the two fine delay lines.

13. The delay locked loop of claim 12, wherein the at least two fine detection windows comprise first and second fine detection windows, and
    wherein each of the first and the second fine detection windows has a half size of the resolution of the two fine delay lines.

14. The delay locked loop of claim 10, wherein the phase detection part comprises:
    a first detection part generating a first control code by judging whether the reference signal is in the first area and the two fine detection windows;
    a second detection part generating a second control code by judging whether the reference signal is in the second area and in the two fine detection windows; and
    a third detection part generating a third control code by judging the reference signal is in the two fine detection windows.

15. The delay locked loop of claim 14, wherein the first, second and third control codes independently comprise an upward control value and a downward control value and wherein if the reference signal is in the first area, the first, second and third detection parts output the upward value.

16. The delay locked loop of claim 14, wherein the first, second and third control codes independently comprise an upward control value and a downward control value and wherein if the reference signal is in the second area, the first, second and third detection parts output the downward value.

17. The delay locked loop of claim 14, wherein the first, second and third control codes independently comprise an upward control value and a downward control value and wherein if the reference signal is in any one of the two fine detection windows, the first detection part outputs the downward control value, the second detection part outputs the upward control value and the third detection part outputs the upward value, or the first detection part outputs the downward control value, the second detection part outputs the downward control value and the third detection part outputs the upward value.

18. The delay locked loop of claim 14, further comprising a phase control signal generation part generating a phase control signal using the first, second and third control codes.

19. The delay locked loop of claim 18, wherein the phase control signal comprises an upward control signal, a downward control signal and a locking control signal.

20. A method for phase adjustment in a delay locked loop (DLL) comprising:

delaying a clock signal to generate at least two delay signals including first and second delay signals with different phase;

generating at least one signal with a phase between the phases of the first and second delay signals; and comparing a phase of the clock signal with the first delay signal, the second delay signal and the at least one signal.

* * * * *